US009903924B2

United States Patent
Biber

(10) Patent No.: US 9,903,924 B2
(45) Date of Patent: Feb. 27, 2018

(54) MR MARKER FOR MAGNETIC RESONANCE IMAGING

(71) Applicant: Stephan Biber, Erlangen (DE)

(72) Inventor: Stephan Biber, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 878 days.

(21) Appl. No.: 14/450,416

(22) Filed: Aug. 4, 2014

(65) Prior Publication Data

US 2015/0045655 A1    Feb. 12, 2015

(30) Foreign Application Priority Data

Aug. 8, 2013   (DE) .................. 10 2013 215 722

(51) Int. Cl.

| G01R 33/34 | (2006.01) |
|---|---|
| G01R 33/36 | (2006.01) |
| G01R 33/58 | (2006.01) |
| G01R 33/422 | (2006.01) |

(52) U.S. Cl.
CPC ... *G01R 33/34084* (2013.01); *G01R 33/3642* (2013.01); *G01R 33/3664* (2013.01); *G01R 33/58* (2013.01); *G01R 33/3692* (2013.01); *G01R 33/422* (2013.01)

(58) Field of Classification Search
USPC ................... 324/307–309, 316–318
See application file for complete search history.

(56) References Cited

U.S. PATENT DOCUMENTS

| 8,436,614 B2 | 5/2013 | Biber |
| 2014/0018664 A1 | 1/2014 | Weiss et al. |
| 2014/0077811 A1* | 3/2014 | Lin .................. A61B 5/055 |
| | | 324/309 |

FOREIGN PATENT DOCUMENTS

| DE | 102008063457 B3 | 6/2010 |
| WO | WO2012137148 A1 | 10/2012 |

OTHER PUBLICATIONS

German Office Action dated Apr. 10, 2014 for corresponding DE 10 2013 215 722.3 with English translation.
Nicola De Zanche, et al., "NMR Probes for Measuring Magnetic Fields and Field Dynamics in MR Systems," Magnetic Resonance in Medicine 60, pp. 176-186, 2008.

(Continued)

*Primary Examiner* — Vincent Q Nguyen
(74) *Attorney, Agent, or Firm* — Lempia Summerfield Katz LLC

(57) ABSTRACT

An MR marker for magnetic resonance imaging includes: (1) a closed volume containing a marker medium, (2) a first marker coil surrounding the volume for detecting an MR signal from the marker medium, (3) an RF shield which surrounds at least the volume and the first marker coil and screens against external RF fields, (4) a second marker coil, arranged outside the RF shield, for inductive and/or capacitive coupling to a magnetic field, and/or for emitting the MR signal detected by the first marker coil, (5) a first electrical interface for controllable electrical connection of the first marker coil to the magnetic resonance imaging scanner, (6) a second electrical interface for controllable coupling of the second marker coil and first marker coil, and (7) an electrical controller with which the first interface and/or the second interface may be controlled.

20 Claims, 3 Drawing Sheets

Legend:
101 – MR marker
103 – transmit/receive coil
201 – marker medium
202 – first marker coil
203 – RF shield
204 – unit for impedance matching
205 – switch
206 – control signal
207 – unit for impedance matching
208 – unit for impedance matching
209 – amplifier
210 – second marker coil
301 – first interface
302 – second interface

(56) References Cited

OTHER PUBLICATIONS

Christoph Barmet, et al., "A Transmit/Receive System for Magnetic Field Monitoring of in Vivo MRI," Magnetic Resonance in Medicine 62, pp. 269-276, 2009.
Betram J. Wilm, et al. "Higher Order Reconstruction for MRI in the Presence of Spatiotemporal Field Perturbations," Magnetic Resonance in Medicine 65, pp. 1690-1701, 2011.
Chris J. Bakker, et al., "Visualization of dedicated catheters using fast scanning techniques with potential for MR-guided vascular interventions," MRM 36, pp. 616-620, 1996.
Christianus J. βakker, et al., "MR-guided Endovascular Interventions: Susceptibility-based Catheter and Near-Real-Time Imaging Technique," in Radiology 202, pp. 273-276, 1997.
Jan-Henry Seppenwoolde, et al., "Passive Tracking Exploiting Local Signal Conservation: The White Marker Phenomenon," Magnetic Resonance in Medicine 50, pp. 784-790, 2003.
Jeffrey L. Duerk, et al., "A brief review of hardware for catheter tracking in magnetic resonance imaging." Magnetic Resonance Materials in Physics, Biology and Medicine 13, pp. 199-208, 2002.

\* cited by examiner

Legend:

- 101 – MR marker
- 103 – transmit/receive coil
- 201 – marker medium
- 202 – first marker coil
- 203 – RF shield
- 204 – unit for impedance matching
- 205 – switch
- 206 – control signal
- 207 – unit for impedance matching
- 208 – unit for impedance matching
- 209 – amplifier
- 210 – second marker coil
- 301 – first interface
- 302 – second interface Legend:

101 – MR marker
103 – transmit/receive coil
201 – marker medium
202 – first marker coil
203 – RF shield
207 – unit for impedance matching
208 – unit for impedance matching
209 – amplifier
210 – second marker coil
211 – diplexer
301 – first interface
302 – second interface

MR MARKER FOR MAGNETIC RESONANCE IMAGING

CROSS-REFERENCE TO RELATED APPLICATIONS

This application claims the benefit of DE 10 2013 215722.3, filed on Aug. 8, 2013, which is hereby incorporated by reference in its entirety.

TECHNICAL FIELD

The present embodiments relate to MR markers for magnetic resonance imaging. As used herein, "MR" refers to magnetic resonance imaging or nuclear magnetic resonance (NMR).

BACKGROUND

MR markers may be subdivided into passive and active MR markers. Passive markers may be detected in the MR image by their special contrast if they are situated in the imaging plane. The contrast is caused either by signal extinguishing (e.g., negative contrast) or signal amplification (e.g., positive contrast), as in the case of the inductively coupled coil. Signal extinctions are, for example, caused by susceptibility markers made from dysprosium oxide ($Dy_2O_3$). The susceptibility differences between the markers and the surrounding tissue lead to field gradients that cause a more rapid dephasing of the magnetization, and thus a signal reduction. It is also possible, by relocating the magnetization, to achieve a signal amplification by simultaneously suppressing the background signal (e.g., a so-called white marker). There are also systems that cause switchable signal changes and may thus, for example, be detected by change in the signal. Systems with direct signal readout, (e.g., small receive coils), are denoted as active marker systems.

MR markers are used today in magnetic resonance imaging to detect and/or to mark the current position of the marker in an examination volume. MR markers are, furthermore, used to measure dynamic and static properties of the electromagnetic fields (e.g., $B_1$, $B_0$, gradient fields) of the magnetic resonance imaging scanner.

An active MR marker may include a vessel (e.g., a tube) with a marker medium, for example, a small quantity of water (optionally doped with $NiSO_4$ or similar salt to reduce the T1/T2 times). The tube is surrounded by a coil that detects the MR signals that come from the marker medium (e.g., water) of the tube. The MR signals are, for example, used to measure fluctuations in the $B_0$ field or to measure gradient effects (e.g., eddy currents of the gradient coils). In this case, the TX field exciting the marker medium is, for example, produced by the same coil of the magnetic resonance imaging scanner as the TX field. The same coil may also be used for the MR imaging (e.g., the so-called "body coil", alternatively, or in addition, also local coils). The signals received by the coil, which surrounds the tube, are evaluated. However, the signals emitted by the marker medium are also received by the receive coil of the magnetic resonance imaging scanner for imaging (e.g., a body coil or local coil), and may lead to convolutions in the MR imaging.

The problems associated with the use of previously known MR markers reside in the fact that the MR markers produce MR signals and may therefore produce pixels outside an examination object during MR imaging. In order also to image the pixels during a measurement, the field of view (FOV) is enlarged. This leads to extension of the measurement time, or a risk of convolutions that reduce the diagnostic value of the MR image produced, and thereby renders misdiagnosis possible through convolution of the marker signal.

SUMMARY AND DESCRIPTION

The object of the present embodiments is to specify an MR marker (e.g., an active MR marker) that at least reduces the problems addressed above. The MR marker is further intended to be useful for field correction methods or as a quasi invisible MR marker in MR imaging for finding the position of other devices or objects that are used or placed in a magnetic resonance imaging scanner (e.g., coils, intervention instruments, patient position).

An MR marker is proposed for magnetic resonance imaging that includes (1) a closed volume containing a marker medium, (2) a first marker coil at least partially surrounding the volume for detecting an MR signal from the marker medium as signal S, (3) an RF shield that surrounds the volume and the first marker coil and screens against external RF fields that may be produced by a magnetic resonance imaging scanner, (4) a second marker coil, arranged outside the RF shield for inductive and/or capacitive coupling to a magnetic field (in particular to a $B_1$ field) that may be produced by the magnetic resonance imaging scanner, and/or for emitting the signal S detected by the first marker coil, (5) a first electrical interface for controllable electrical connection of the first marker coil to the magnetic resonance imaging scanner, (6) a second electrical interface for controllable coupling of the second marker coil and first marker coil, and (7) an electrical controller with which the first interface and/or the second interface may be controlled.

The term of the "first" or "second electrical interface" refers to and includes mechanically separable interfaces (e.g., switches/relays), but also interfaces that have electronic components (e.g., filters, band passes, capacitors, diodes, transistors, etc.) that permit a signal line under prescribed conditions and prevent a signal line under other conditions.

The proposed MR marker is screened for high-frequency fields, for example, $B_1$ fields of the magnetic resonance imaging scanner.

A connection to a transmit field (TX field, for example, $B_1$ field) of the magnetic resonance imaging scanner and/or to a receive field (RX field) of the magnetic resonance imaging scanner may be measured by inductive coupling of the MR marker either to the TX field, the RX field, or to both fields.

Owing to the screening, the proposed MR marker is largely MR-invisible in MR imaging and permits inductive coupling of the RX field and/or the TX field of the magnetic resonance imaging scanner to the second marker coil. This second marker coil functions in one case as a receive coil for the TX field, and in the other case, as a transmit coil for coupling to the RX field. As a result, the technical design of the proposed MR marker is simpler, less susceptible to failure and, therefore, more reliable as compared with the known MR marker. The proposed MR marker may be used for field correction methods (e.g., $B_0$ drift, eddy currents) or for detecting position in MR imaging. In one embodiment, the coupling between the MR marker and the magnetic resonance imaging scanner is performed explicitly inductively so that it is possible to dispense completely with a wired connection between the MR marker and magnetic resonance imaging scanner.

The volume in which the marker medium is placed is closed by an appropriate housing. The housing may have the shape of a tube, which may have an outside diameter in the range of 0.5 to 5 mm, or in particular, the outside diameter may be 1 mm, 2 mm, 3 mm, or 4 mm. The tube may have a length of 5 to 80 mm, or, in particular, the tube may have a length of 10 mm, 15 mm, 20 mm, 30 mm, 40 mm, 50 mm, 60 mm, 70 mm. The housing advantageously includes glass.

The marker medium advantageously contains water ($H_2O$), if appropriate with additives such as, for example, cyclohexane $C_6H_{12}$, hexafluorobenzene $C_6F_6$, or Cr(III) (TMHD)$_3$ (tris(2,2,6,6-tetramethyl-3,5-heptanedionato) chromium).

The controller includes at least an electronic component, for example, a switch or a bandpass filter.

The RF shield serves, in particular, to screen $B_1$ fields, which may be produced by a magnetic resonance imaging scanner. The RF shield advantageously includes metal with a wall thickness in the range of 0.1 to 200 μm, or, in particular, a range of 1 μm, 5 μm, 10 μm, 20 μm, 50 μm, 70 μm, 90 μm, 100 μm, 150 μm, 180 μm. The RF shield further advantageously has slits. The slits are advantageously bridged with a capacitance in the range from 0.1 to 100 nF. The RF shield may, furthermore, advantageously be designed in such a way that few to no gradient-induced eddy currents are produced in the RF shield itself.

One development of the MR marker is distinguished in that the controller distinguishes only two operating states of the MR marker: a transmit mode (TX mode) and a receive mode (RX mode), the controller controlling the first and/or the second interface as a function of the prescribable current operating state of the marker.

One development of the MR marker is distinguished in that the controller has an interface for receiving a control signal, the controller controlling the first and/or the second interface as a function of the received control signal. The control signal is advantageously produced by the magnetic resonance imaging scanner and passed on to the interface of the MR marker. In one embodiment, the control signal has two control states: (1) transmit mode (TX mode) and (2) receive mode (RX mode).

One development of the MR marker is distinguished in that a connection of the first interface and a magnetic resonance imaging scanner is designed as a wired signal line in order to transmit the signal S, detected by the first marker coil, to the magnetic resonance imaging scanner. In this case, the signal S may thus be transmitted to the magnetic resonance imaging scanner by wire. If appropriate, one or more surface wave filters are required on the signal line to transmit the signal S.

One development of the MR marker is distinguished in that, in order to transmit the signal S to the magnetic resonance imaging scanner, the controller is designed and set up in such a way that the signal S is transmitted from the first marker coil to the second marker coil and emitted by the second marker coil. Additionally, a receive coil of the magnetic resonance imaging scanner is able to receive the emitted signal S (RX coupling). The signal S is therefore transmitted to the magnetic resonance imaging scanner by coupling to an RX field of the magnetic resonance imaging scanner. The MR marker may therefore also be used independently of a cable connection to the magnetic resonance imaging scanner. In this case, coupling both to the TX field and to the RX field of the magnetic resonance imaging scanner is performed inductively via the second marker coil.

One development of the MR marker is distinguished in that the controller includes an electric switch that, in the transmit mode (TX mode), inactivates the first interface to the electrical signal line and activates the second interface to the electrical signal line. Additionally, in the receive mode (RX mode), the electric switch activates the first interface to the electrical signal line and inactivates the second interface to the electrical signal line.

In the receive mode (RX mode), the first marker coil is switched to a receiver of the magnetic resonance imaging scanner by wire, or coupled inductively to a receiver coil of the receiver of the magnetic resonance imaging scanner (RX coupling). In the case of an inductive TX coupling and RX coupling via cable, the second marker coil is thereby switched away from the first marker coil. In the case of excitation by wire, it is possible to switch from a TX cable to an RX cable. The switch may be triggered by a DC signal that, if appropriate, may also be produced by inductive coupling and rectification from the transmit field (TX field).

In the case of inductive RX and TX coupling of the second marker coil, it is possible to produce MR markers that may be used independently of a cable connection to the magnetic resonance imaging scanner. In order to receive the RX signal, the MR marker may be coupled inductively to an RX receive coil of the magnetic resonance imaging scanner in the case of specific parts of a pulse sequence of the magnetic resonance imaging scanner. Therefore, it is possible to provide a switch in the MR marker that may be operated automatically by an appropriate low-frequency switching signal. The omission of RF cable connections between MR marker and magnetic resonance imaging scanner is advantageous, since the connections are provided with surface wave filters, which are costly and space-consuming.

One development of the MR marker is distinguished in that the controller has at least one impedance matching unit for the first electrical interface, and/or an impedance matching unit for the second electrical interface.

Another development of the MR marker is distinguished in that the controller on the second electrical interface has an amplification unit.

Yet another development of the MR marker is distinguished in that the impedance matching unit and/or the controller are/is arranged inside the RF shield.

Another development of the MR marker is distinguished in that the impedance matching unit and/or the controller are/is arranged outside the RF shield.

The proposed design of the MR marker in terms of circuitry and electromagnetization enables measures to be used to reduce the visibility of the MR marker for MR imaging, or to remove it entirely, while nevertheless implementing the function as marker for position detection or field measurement (e.g., $B_0$, $B_1$, gradient field).

The scope of the present invention is defined solely by the appended claims and is not affected to any degree by the statements within this summary. The present embodiments may obviate one or more of the drawbacks or limitations in the related art.

DETAILED DESCRIPTION

Figure 1:
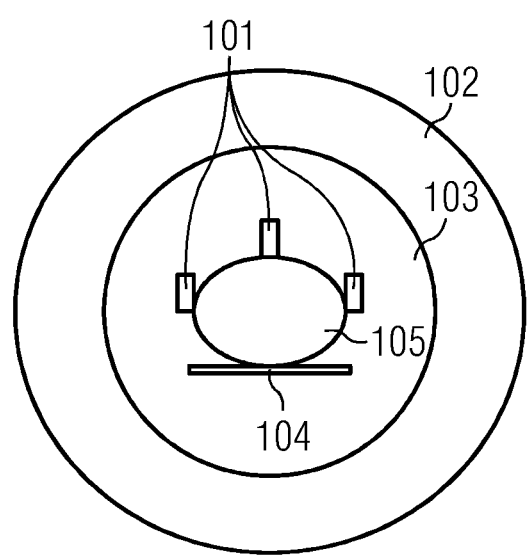
FIG. 1 depicts an embodiment of a schematic representation of a magnetic resonance imaging scanner with a transmit/receive coil (e.g., body coil, three MR markers, and an examination object on a patient table).

FIG. 1 depicts an embodiment of a schematic representation of a magnetic resonance imaging scanner 102 with a transmit/receive coil (e.g., body coil) 103, three MR markers 101 arranged on an examination object 105, and a patient table 104. The transmit/receive coil 103 serves here to emit a TX field and to receive an RX field in the magnetic resonance imaging scanner. Alternatively, or in addition, the TX field and the RX field may also be respectively emitted and received by a local coil. The TX field and the RX field have the Larmor frequency $f_{Larmor}$ of the particles (e.g., protons) respectively concerned. The TX field excites the particles in the examination object, and, at the same time, in the marker medium 201 of the three MR markers 101. The excited particles produce MR signals and thus a receivable RX field.

Figure 2:
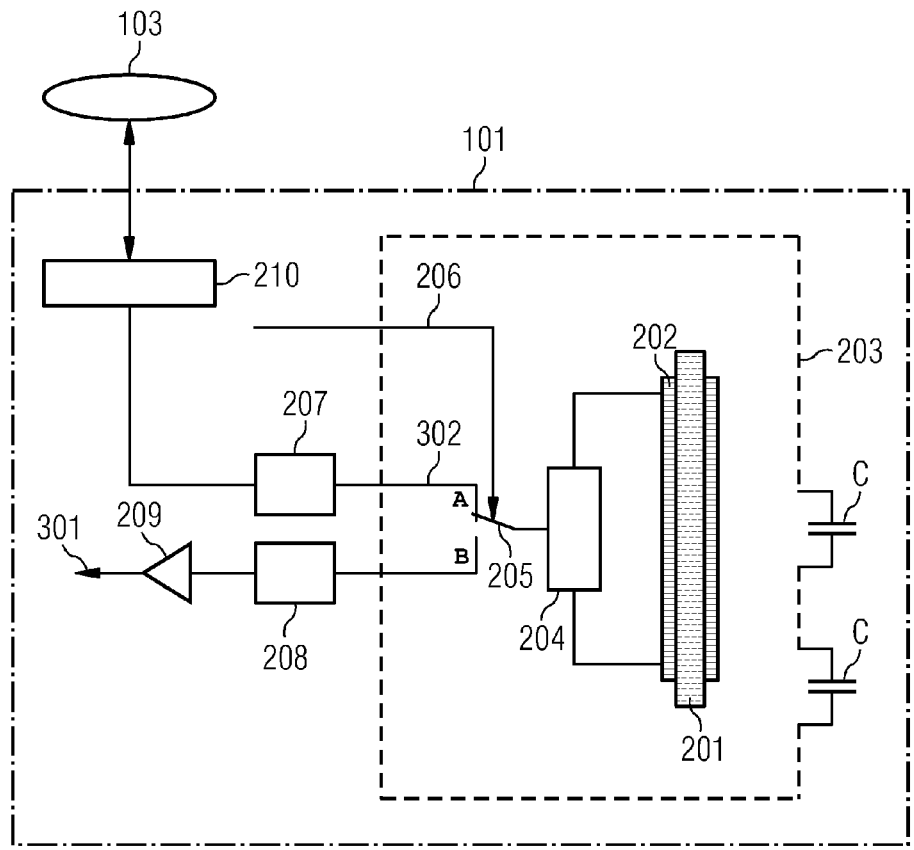
FIG. 2 depicts an embodiment of a schematic setup of an MR marker.

FIG. 2 depicts an embodiment of schematic setup of an MR marker 101. The MR marker 101 includes a closed volume, surrounded here by a glass tube containing a marker medium 201, and a first marker coil 202, surrounding the volume, for detecting an MR signal from the marker medium as signal S. FIG. 2 depicts the volume surrounded by the marker coil 202 in longitudinal section for the sake of clarification.

The first marker coil 202 is connected to a unit 204 for impedance matching. The unit 204 is, furthermore, connected to a switch 205 that optionally connects the unit 204 electrically to a first interface 301 (e.g., position B) or to a second interface 302 (e.g., position A).

The MR marker coil 101 further has an RF shield 203 that surrounds the volume and the first marker coil 202 and shields against external RF fields that may be produced by a magnetic resonance imaging scanner 102. The RF shield 203 here permits the penetration of gradient fields of the magnetic resonance imaging scanner, while RF fields (e.g., $B_1$ fields) are strongly shielded (e.g., greater than 40 dB). The RF shield 203 includes a metal with a thickness of the RF shield walls in the range of 5-200 µm. The RF shield 203 further has cutouts (e.g., slits) that are respectively bridged by a capacitor C with a capacitance in the range of 0.1-100 nF.

The MR marker 101 further includes a second marker coil 210, arranged outside the RF shield 203, which serves for inductive and/or capacitive coupling to a magnetic field that may be produced by the magnetic resonance imaging scanner 102 and/or for emitting the signal S detected by the first marker coil 202.

The reference numerals 207 and 208 respectively denote units for impedance matching. The reference numeral 209 denotes an amplifier, such as, for example, a so-called low noise amplifier, LNA.

The reference numeral 301 denotes a first electrical interface for controllable electrical connection of the first marker coil 202 to the magnetic resonance imaging scanner 102. The reference numeral 302 denotes a second electrical interface for controllably coupling/connecting the second marker coil 210 to the first marker coil 202 relating to the signal line. Finally, the MR marker 101 includes an electrical controller with which the first interface 301 and/or the second interface 302 may be controlled. The electrical controller includes, in this case, the switch 205, which is controlled/switched on the basis of a control signal 206 provided externally via an appropriate interface, the units for impedance matching 204, 207, 208 and the amplifier 209.

In transmit mode (TX mode), the switch 205 is in the position "A" and passes on signals received from the second marker coil 210 to the first marker coil 202. In receive mode (RX mode), the switch 205 is in the position "B" and passes onto the magnetic resonance imaging scanner 102 the signal S detected by the first marker coil 202 from the marker medium, so that the signal S may not be coupled to the (receive) coil 103 of the magnetic resonance imaging scanner 102.

Figure 3:
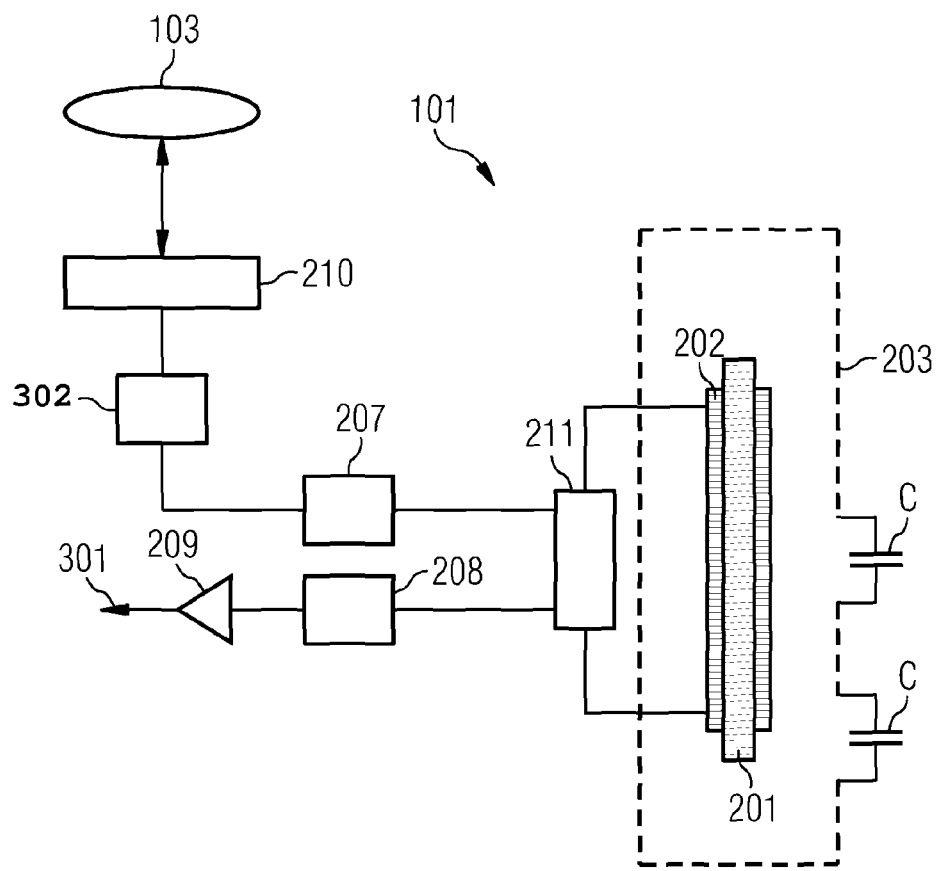
FIG. 3 depicts an additional embodiment of a schematic setup of an MR marker.

As explained above, the switching signal 206 serves for controlling the switch 205. The switching signal 206 may be provided by the magnetic resonance imaging scanner 102. The external provision of the switching signal 206 may be replaced in one development by having the switching signal 206 produced by the marker itself by rectifying a signal (e.g., TX signal of the magnetic resonance imaging scanner) received by the second marker coil 210. FIG. 3 depicts an embodiment of schematic setup of an MR marker 101. In contrast to FIG. 2, the RF shield 203 now surrounds only the volume with the marker liquid 201 and the first marker coil 202, which partially surrounds the volume. The first marker coil 202 is connected to a diplexer 211 in this embodiment. Furthermore, the diplexer 211 is connected via the unit 208 for impedance matching and the low noise amplifier 209 to the first interface 301. The diplexer 211 is also connected via the unit 208 for impedance matching 207 to the second interface 302 of the second marker coil 201. In this exemplary embodiment, the second interface 302 has a bandpass filter including capacitors and at least one diode D that prevents a signal S detected by the first marker coil 202 not being transmitted, or being transmitted only weakly to the second marker coil 210. For example, the coupling attenuation between the first marker coil 202 and second marker coil 201 is substantially more than 40 dB.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance (MR) marker for magnetic resonance imaging, the MR marker comprising:
a closed volume containing a marker medium;
a first marker coil surrounding the closed volume for detecting a MR signal from the marker medium;
a RF shield that surrounds at least the closed volume and the first marker coil and screens against external RF fields;
a second marker coil, arranged outside the RF shield, for inductive, capacitive, or inductive and capacitive coupling to a magnetic field, and/or for emitting the MR signal detected by the first marker coil;

a first electrical interface for controllable electrical connection of the first marker coil to a magnetic resonance imaging scanner;

a second electrical interface for controllable coupling of the second marker coil and the first marker coil; and an electrical controller configured to control the first electrical interface, the second electrical interface, or the first and second electrical interfaces.

2. The MR marker as claimed in claim 1, wherein the electrical controller distinguishes two operating states of the MR marker: (1) a transmit mode and (2) a receive mode, and wherein the first electrical interface or the second electrical interface is controlled as a function of a prescribable current operating state of the MR marker.

3. The MR marker as claimed in claim 2, wherein the electrical controller comprises an electric switch that: (1) in the transmitting mode, inactivates the first electrical interface to an electrical signal line and activates the second electrical interface to the electrical signal line and (2) in the receive mode, activates the first electrical interface to the electrical signal line and inactivates the second electrical interface to the electrical signal line.

4. The MR marker as claimed in claim 2, wherein the electrical controller comprises an interface for receiving a control signal, wherein the electrical controller controls the first electrical interface, the second electrical interface, or the first and second electrical interfaces as a function of the received control signal.

5. The MR marker as claimed in claim 4, wherein the electrical controller comprises an electric switch that: (1) in the transmitting mode, inactivates the first electrical interface to an electrical signal line and activates the second electrical interface to the electrical signal line and (2) in the receive mode, activates the first electrical interface to the electrical signal line and inactivates the second electrical interface to the electrical signal line.

6. The MR marker as claimed in claim 4, wherein a connection of the first electrical interface and the magnetic resonance imaging scanner is configured as a wired signal line to transmit the MR signal to the magnetic resonance imaging scanner.

7. The MR marker as claimed in claim 6, wherein the electrical controller is configured to transmit the MR signal from the first marker coil to the second marker coil, wherein the MR signal is emitted by the second marker coil, and a receiving coil of the magnetic resonance imaging scanner is configured to receive the emitted MR signal.

8. The MR marker as claimed in claim 1, wherein a connection of the first electrical interface and the magnetic resonance imaging scanner is configured as a wired signal line to transmit the MR signal to the magnetic resonance imaging scanner.

9. The MR marker as claimed in claim 1, wherein the electrical controller is configured to transmit the MR signal from the first marker coil to the second marker coil, wherein the MR signal is emitted by the second marker coil, and a receiving coil of the magnetic resonance imaging scanner is configured to receive the emitted MR signal.

10. The MR marker as claimed in claim 9, wherein the electrical controller has at least one impedance matching unit for the first electrical interface, at least one an impedance matching unit for the second electrical interface, or both.

11. The MR marker as claimed in claim 9, wherein the electrical controller comprises an electric switch that: (1) in the transmitting mode, inactivates the first electrical interface to an electrical signal line and activates the second electrical interface to the electrical signal line and (2) in the receive mode, activates the first electrical interface to the electrical signal line and inactivates the second electrical interface to the electrical signal line.

12. The MR marker as claimed in claim 11, wherein the electrical controller has at least one impedance matching unit for the first electrical interface, at least one an impedance matching unit for the second electrical interface, or both.

13. The MR marker as claimed in claim 12, wherein the electrical controller has an amplification unit on the second electrical interface.

14. The MR marker as claimed in claim 1, wherein the electrical controller has at least one impedance matching unit for the first electrical interface, at least one an impedance matching unit for the second electrical interface, or both.

15. The MR marker as claimed in claim 14, wherein the electrical controller is arranged inside the RF shield.

16. The MR marker as claimed in claim 14, wherein the electrical controller is arranged outside the RF shield.

17. The MR marker as claimed in claim 1, wherein the electrical controller has an amplification unit on the second electrical interface.

18. The MR marker as claimed in claim 17, wherein the electrical controller is arranged inside the RF shield.

19. The MR marker as claimed in claim 17, wherein the electrical controller is arranged outside the RF shield.

20. The MR marker as claimed in claim 1, wherein the external RF fields are produced by the magnetic resonance imaging scanner.

* * * * *